United States Patent
Lin et al.

(10) Patent No.: US 12,009,235 B2
(45) Date of Patent: Jun. 11, 2024

(54) IN-CHAMBER LOW-PROFILE SENSOR ASSEMBLY

(71) Applicant: Applied Materials, Inc., Santa Clara, CA (US)

(72) Inventors: Chuang-Chia Lin, San Ramon, CA (US); Wenwei Qiao, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 706 days.

(21) Appl. No.: 17/109,019

(22) Filed: Dec. 1, 2020

(65) Prior Publication Data
US 2022/0172968 A1 Jun. 2, 2022

(51) Int. Cl.
| | |
|---|---|
| *H01L 21/67* | (2006.01) |
| *C23C 16/52* | (2006.01) |
| *G01F 15/06* | (2022.01) |
| *G01F 15/063* | (2022.01) |
| *G01F 15/14* | (2006.01) |
| *G01L 15/00* | (2006.01) |
| *G01L 19/08* | (2006.01) |

(Continued)

(52) U.S. Cl.
CPC ........ *H01L 21/67253* (2013.01); *C23C 16/52* (2013.01); *G01F 15/063* (2013.01); *G01F 15/14* (2013.01); *G01L 15/00* (2013.01); *G01L 19/086* (2013.01); *G01L 19/14* (2013.01); *G01N 25/18* (2013.01); *H01J 37/32715* (2013.01); *H01J 37/32935* (2013.01); *H01J 37/32082* (2013.01); *H01J 2237/2007* (2013.01); *H01J 2237/3343* (2013.01); *H01L 21/67069* (2013.01)

(58) Field of Classification Search
None
See application file for complete search history.

(56) References Cited

U.S. PATENT DOCUMENTS 6,244,121 B1 * 6/2001 Hunter .................. H01L 21/681
73/866.5
6,279,402 B1 8/2001 Fisher
(Continued)

FOREIGN PATENT DOCUMENTS

WO 2017131878 A1 8/2017

OTHER PUBLICATIONS

International Search Report and Written Opinion for the International Application No. PCT/US2021/061003, dated Mar. 24, 2022, 11 pages.

*Primary Examiner* — Robert K Carpenter
(74) *Attorney, Agent, or Firm* — Lowenstein Sandler LLP

(57) ABSTRACT

A sensor assembly that includes a substrate and a set of sensors. The set of sensor includes pressure sensor and/or flow sensors located across a surface of the substrate. Each respective sensor of the plurality of sensor is adapted to measure a respective pressure or a respective flow of an environment proximate the respective sensor. Each respective sensor of the plurality of sensor may further be adapted to output a respective signal associated with the measured respective pressure or the measured respective flow. The respective signals associated with the measured respective pressure or the measured respective flows measured by the plurality of sensor together provide a pressure distribution across the surface of the substrate and/or a flow distribution across the surface of the substrate.

12 Claims, 7 Drawing Sheets

(51) Int. Cl.
*G01L 19/14* (2006.01)
*G01N 25/18* (2006.01)
*H01J 37/32* (2006.01)

(56) References Cited

U.S. PATENT DOCUMENTS

| | | | |
|---|---|---|---|
| 6,553,277 B1* | 4/2003 | Yagisawa | H01L 22/34 |
| | | | 700/121 |
| 6,738,722 B2* | 5/2004 | Polla | G01D 3/022 |
| | | | 702/90 |
| 6,807,503 B2* | 10/2004 | Ye | H01L 21/67276 |
| | | | 438/18 |
| 2006/0234398 A1* | 10/2006 | Gluschenkov | H01L 21/67294 |
| | | | 118/712 |
| 2007/0107523 A1 | 5/2007 | Galewski | |
| 2008/0171131 A1 | 7/2008 | Moro et al. | |
| 2008/0228419 A1* | 9/2008 | Renken | H01L 22/34 |
| | | | 702/81 |
| 2009/0101848 A1 | 4/2009 | Walther et al. | |
| 2011/0209815 A1* | 9/2011 | Aono | G01C 19/56 |
| | | | 156/146 |
| 2017/0221775 A1* | 8/2017 | Tedeschi | H01L 21/67253 |
| 2017/0365531 A1* | 12/2017 | Tedeschi | G01D 5/24 |

\* cited by examiner

IN-CHAMBER LOW-PROFILE SENSOR ASSEMBLY

TECHNICAL FIELD

Some embodiments of the present disclosure relate, in general, to an in-chamber low-profile sensor assembly to measure an environmental condition within a chamber. Embodiments additionally relate to systems and methods for determining pressure and/or flow distributions within a processing chamber.

BACKGROUND

Chambers are used in many types of processing systems. Examples of such chambers include etch chambers, deposition chambers (including chambers for atomic layer deposition, chemical vapor deposition, or plasma enhanced versions thereof), anneal chambers, and the like. Typically, a substrate, such as a semiconductor wafer, is placed in a chamber and conditions in the chamber are set and maintained to process the substrate. Generally, it is advantageous to minimize the processing differences, such as the thickness of a deposited layer and the depth of an etch across the wafer.

Minimizing the process differences across a wafer depends on controlling the parameters that affect the process, such as wafer surface temperature, gas flow rate, and chamber pressure. Variations in processing parameters across the wafer can result in non-uniform processing or other negative effects during waver processing.

Often, variations in a processing parameter are measured by evaluating trial wafers or performing simulations rather than by measuring the parameters directly. For example, the thickness of a chemical vapor deposition (CVD) layer may be measured at several points across each wafer in a series of wafers processed at different nominal chamber pressures to evaluate the effect of pressure on the thickness of the layer. The nominal chamber pressure is typically measured by a pressure gauge at a single point of the chamber. However, the nominal chamber pressure does not necessarily indicate either the actual pressure at the surface of the wafer or the local pressure variations that can occur across the surface of a wafer arising from the dynamic effects of gas flow.

SUMMARY

In an example embodiment, a sensor assembly may include a substrate and a set of sensors. The set of sensors includes pressure sensors and/or flow sensors located across a surface of the substrate. Each respective sensor of the set of sensors is adapted to measure a respective pressure or a respective flow of an environment proximate the respective sensor. Each respective sensor of the set of sensors may further be adapted to output a respective signal associated with the measured respective pressure or the measured respective flow. The respective signals associated with the measured respective pressure or the measured respective flows measured by the plurality of sensors together provide a pressure distribution across the surface of the substrate and/or a flow distribution across the surface of the substrate.

In an example embodiment, a sensor system may include a processing chamber and a sensor assembly disposed within the processing chamber, the sensor assembly may include a substrate and a set of sensors having at least pressure sensors and/or flow sensors disposed across a surface of the substrate. Each respective sensor of the set of sensors may be adapted to measure a respective pressure or a respective flow of an environment proximate each respective sensor. The sensor system may further include a processing device communicatively coupled to the sensor assembly. The processing device may be adapted to receive at least one of the measured respective pressures or the measured respective flows and determine a pressure distribution or a flow distribution of the processing chamber.

In an example embodiment, a first process for measuring pressure or flow distribution within a processing chamber may include placing a sensor assembly within the processing chamber. The process may further include detecting, using a set of sensors including pressure sensors and/or flow sensors disposed on a surface of the sensor assembly, a pressure and/or flow at each of the sensors of the sensor assembly. The process may further include transmitting data associated with the respective pressures and/or the respective flows and respective locations of each of the respective sensors to a processing device. The process may further include determining, by the processing device, a pressure distribution and/or a flow distribution of the processing chamber based on the transmitted data.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
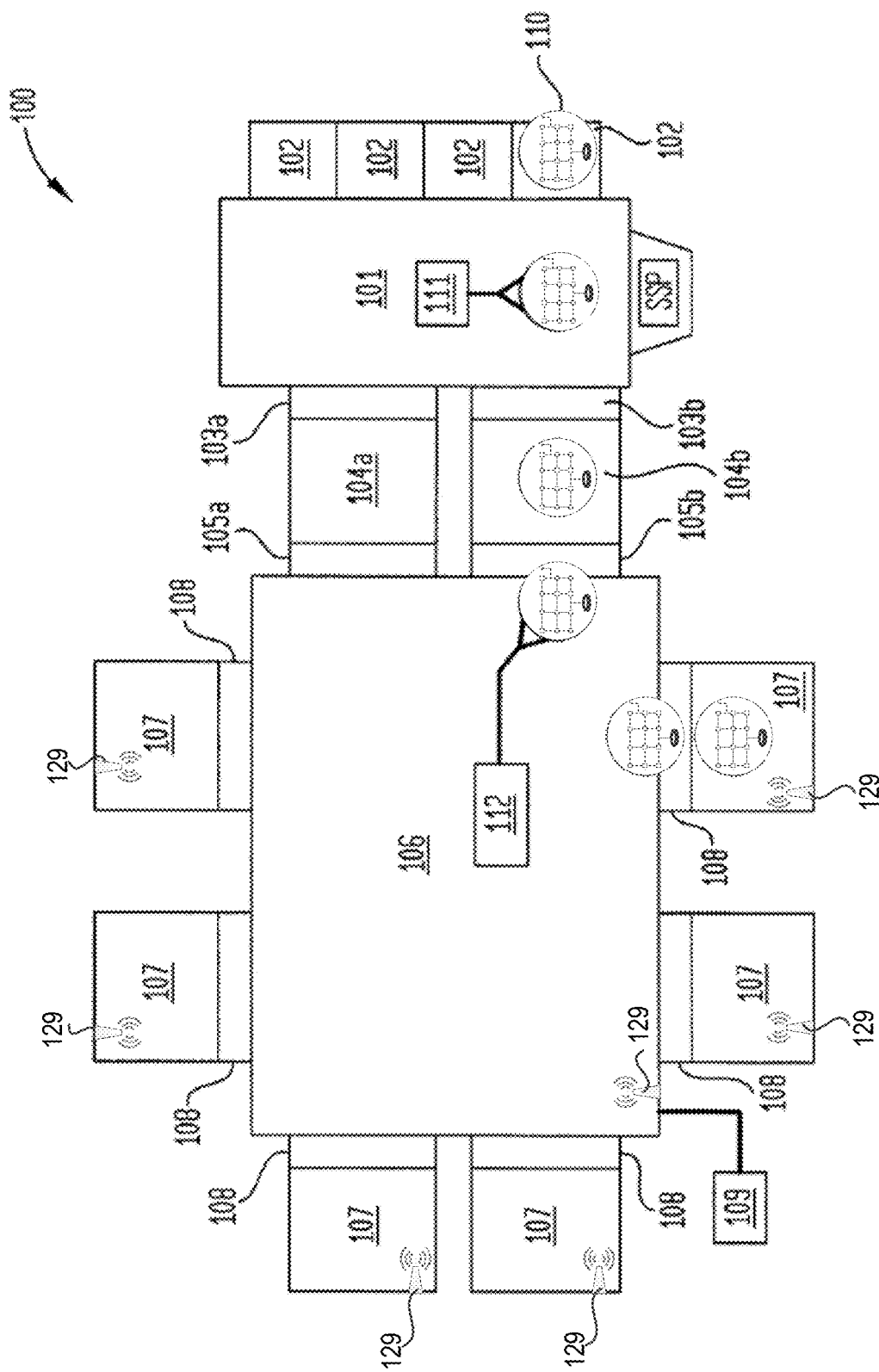
FIG. 1 illustrates a simplified top view of an example processing system, according to aspects of the present disclosure.

Conventionally, when substrates, such as semiconductor wafers, are processed in a processing chamber, the nominal chamber pressure may not accurately reflect the local pressure at the surface of the substrates. For example, the pressure on the surface of a substrate directly across from a gas inlet or nozzle can be greater than the nominal chamber pressure, which is often measured at a chamber location removed from the wafer. Some processes, such as chemical vapor deposition (CVD) or etch processes, are sensitive to variations in the pressure. If the result of a process is not uniform across a wafer, increased yield loss of chips from the wafer may result. The advantages of uniform processing have increased as device geometry has become smaller and also as the size of the substrate has become larger.

Embodiments of the present disclosure provide for devices and systems of in-chamber low-profile sensor assemblies for measuring pressure and/or flow within a chamber and associated processes for measuring pressure and/or flow within a chamber. Specifically, embodiments disclosed herein are directed to devices, systems, and processes directed towards measuring pressure and/or flow on a surface of a sensor assembly (e.g., a sensor wafer) within a processing chamber. Embodiments are also directed to determining (e.g., calculating) a pressure distribution and/or a flow distribution across the surface of a substrate (e.g., across the surface of a sensor wafer). Embodiments of the present disclosure include a plurality of sensors (e.g., pressure sensors and/or flow sensors) across a substrate (e.g., sensor wafer) that measure localized pressure and/or flow proximate to each respective sensor. The set of pressure and/or flow measurements can be used together to determine specific pressure and/or flow distributions for subsections of the chamber and/or for substrates that are to be processed. Various disclosed embodiments provide a low-profile device and associated processes for measuring localized pressure and/or flow of a chamber with obstructions (e.g. specialized processing equipment), tight spaces, specialized environments (e.g., vacuum pressure), and/or other challenges common to processing chambers.

Various embodiment may be or employ a sensor assembly that includes a substrate and a set of sensors. The set of sensors includes pressure sensors and/or flow sensors located across a surface of the substrate. Each respective sensor of the plurality of sensors is adapted to measure a respective pressure and/or a respective flow of an environment proximate each respective sensor. Each respective sensor of the plurality of sensors may further be adapted to output a respective signal associated with the measured respective pressure and/or the measured respective flow. The respective signals associated with the measured respective pressures and/or the measured respective flows measured by the plurality of sensor together provide a pressure distribution across the surface of the substrate and/or a flow distribution across the surface of the substrate.

In some further embodiments, the sensor assembly may include a substrate that may include a semiconductor wafer, a printed circuit board (PCB), housing assembly, or combination thereof. The substrate of the sensor assembly may be adapted to be chucked by a chuck of a processing chamber. The sensor assembly may include a packaging layer located on the set of sensors and/or on the substrate between the set of sensors. The combination of the packaging layer and the set of sensors may cover a surface of the substrate and may be aligned to form an approximately flat surface.

In some further embodiments, the sensor assembly may include one or more circuit board to which the set of sensors is connected. The sensor may include a data storage device connected to the circuit board. The data storage device may be adapted to receive and store signals that represent or include pressure and/or flow measurements from the set of sensors. Alternatively, or additionally, the sensor assembly may include a wireless communication circuit connected to the circuit board. The wireless communication circuit may be adapted to transmit the signals to a remote processing device.

In some embodiments, the sensor assembly may include an additional sensor in addition to the set of sensors. The additional sensor may be adapted to detect that a condition of the environment meets a threshold condition. The sensor assembly may further include a micro-controller coupled to the set of sensors and to the additional sensor. The micro-controller may be adapted to receive an indication from the additional sensor that the condition of the environment meets the threshold condition. Responsive to receiving the indication, the controller may switch one or more of the set of sensors between an on status and an off status. The threshold condition may be associated with a vacuum condition of the environment in one embodiment. In one embodiment, one of the sensors in the set of sensors is used to determine whether to turn on or off a remainder of the sensors in the set of sensor rather than using an additional sensor to make such a determination.

In an example embodiment, a sensor system may include a processing chamber and a sensor assembly disposed within the processing chamber, the sensor assembly may include a substrate and a set of sensors having at least pressure sensors and/or flow sensors disposed across a surface of the substrate. Each respective sensor of the set of sensors may be adapted to measure a respective pressure and/or a respective flow of an environment proximate the respective sensor. The sensor system may further include a processing device communicatively coupled to the sensor assembly. The processing device may be adapted to receive the measured respective pressures and/or the measured respective flows and determine a pressure distribution and/or a flow distribution of the processing chamber.

In an example embodiment, a first process for measuring pressure or flow distribution within a processing chamber may include placing a sensor assembly within the processing chamber. The process may further include detecting, using a set of sensors including pressure sensors and/or flow sensors disposed on a surface of the sensor assembly, a pressure and/or flow at each of the sensors of the sensor assembly. The process may further include transmitting data associated with the respective pressures and/or the respective flows and respective locations of each of the respective sensors to a processing device. The process may further include determining, by the processing device, a pressure distribution and/or a flow distribution across a surface of the sensor assembly and/or of the processing chamber based on the transmitted data.

These and similar embodiments provide a number of advantages and improvements in the field of device processing and fabrication where pressure and/or flow dependent processes are performed within a chamber (e.g., fabrication processes, vacuum chamber processes, etc.). These advantages include, for example, more accurate pressure and flow measurements within the chamber, more accurate control of etch depth and/or layer thickness, quicker data reception from pressure and flow measurements, and improved power saving for use with specific chamber conditions.

The sensor assembly of embodiments may provide more accurate pressure and flow measurements than conventional sensors. For example, the sensor assembly may provide localized measurements across a surface of a substrate (e.g., wafer). The assembly may comprise a set of sensors (e.g., 10 or more) and include a low-profile assembly (e.g., less than 2 mm in height). This may provide more precise localized measurements than a global sensor designed to measure the pressure of the entire chamber. Additionally, the low-profile assembly may allow the sensor to fit between chamber processing equipment (showerheads, chucks, deposition devices, etch devices, other sensors, etc.) at a position of a substrate that is to be processed and to measure pressure and/or flow across the substrate during process conditions.

Further, the sensor assembly may provide for actual measurements of pressure and/or flow rather than predictions and simulations that do not directly measure the pressure and/or flow at specific locations within the chamber.

The sensor assembly may provide for quicker data reception for pressure and flow measurements within a chamber. For example, the sensor assembly may provide on demand measurements or measurements that may occur simultaneous to a chamber process or operation (e.g., fabrication, deposition, etch, etc.). The sensor assembly may include communication circuitry to transmit the data external to the chamber for processing before a chamber process is complete. Additionally, the sensor assembly may include a local data store to hold a variety of measurements that can be analyzed after a process is complete.

The sensor assembly may provide improved power saving of a chamber sensor system. The sensor assembly may include an additional sensor that may be coupled to a set of sensors on the assembly. The additional sensor may measure the chamber and detect whether an environmental condition is met (e.g., whether a threshold vacuum pressure is reached, whether a threshold temperature is reached, etc.) The additional sensor may provide a signal that causes a controller to turn one or more of the set of sensors on and/or off when the condition of the chamber is met. The power of the sensors may be controlled by an environmental condition of the chamber. The set of sensors on the sensor assembly may draw power continuously if left on during the entire chamber process. Some embodiments of the present disclosure show how power can be saved by waiting to turn the set of sensors on until the chamber meets desired target condition and turning off the set of sensors when the target condition is no longer present in the chamber.

FIG. 1 illustrates a simplified top view of an example processing system 100, according to aspects of the present disclosure. The processing system 100 includes a factory interface 101 to which a plurality of substrate cassettes 102 (e.g., front opening pods (FOUPs) and a side storage pod (SSP)) may be coupled for transferring substrates (e.g., wafers such as silicon wafers) into the processing system 100. The FOUP, SSP, and other substrate cassettes may together be referred to herein as storage locations. In some embodiments, one or more of the substrate cassettes 102 include, in addition to or instead of wafers to be processed, one or more sensor wafers 110 having sensor assemblies disposed thereon or integrated therein. The sensor assemblies of the sensor wafers 110 may be used to measure pressure and/or flow of an environment. For example, the sensor wafers 110 may be used to measure pressure or flow within one or more processing chambers 107 and other compartments and chambers as will be discussed. The factory interface 101 may also transfer the sensor wafers 110 into and out of the processing system 100 using the same functions for transferring wafers to be processed and/or that have been processed, as will be explained.

The processing system 100 may also include first vacuum ports 103a, 103b that may couple the factory interface 101 to respective stations 104a, 104b, which may be, for example, degassing chambers and/or load locks. Second vacuum ports 105a, 105b may be coupled to respective stations 104a, 104b and disposed between the stations 104a, 104b and a transfer chamber 106 to facilitate transfer of substrates into the transfer chamber 106. The transfer chamber 106 includes multiple processing chambers 107 (also referred to as process chambers) disposed around the transfer chamber 106 and coupled thereto. The processing chambers 107 are coupled to the transfer chamber 106 through respective ports 108, such as slit valves or the like.

The processing chambers 107 may include one or more of etch chambers, deposition chambers (including atomic layer deposition chambers, chemical vapor deposition chambers, physical vapor deposition chambers, and/or plasma enhanced versions thereof), anneal chambers, and/or the like. The processing chambers 107 may include chamber components such as a showerhead or a chuck (e.g., electrostatic chuck), for example.

In various embodiments, the factory interface 101 includes a factory interface robot 111. The factory interface robot 111 may include a robot arm, which may be or include a selective compliance assembly robot arm (SCARA) robot, such as a 2 link SCARA robot, a 3 link SCARA robot, a 4 link SCARA robot, and so on. The factory interface robot 111 may include an end effector on an end of the robot arm(s). The end effector may be configured to pick and handle specific objects, such as wafers. The factory interface robot 111 may be configured to transfer objects between substrate cassettes 102 (e.g., FOUPs and/or SSP) and stations 104a, 104b (e.g., which may be load locks).

The transfer chamber 106 includes a transfer chamber robot 112. The transfer chamber robot 112 may include a robot arm with an end effector at an end of the robot arm. The end effector may be configured to handle particular objects, such as wafers, edge rings, ring kits, and/or sensor wafers 110. The transfer chamber robot 112 may be a SCARA robot, but may have fewer links and/or fewer degrees of freedom than the factory interface 101 robot 111 in some embodiments.

The processing system may include one or more radio frequency (RF) antennas 129 in the processing chambers 107. The RF antennas 129 may be disposed on or within the walls of the processing chambers 107 in embodiments. The RF antennas may be disposed within chamber components in some embodiments. For example RF antennas 129 may be disposed within a chuck (e.g., an electrostatic chuck) or a showerhead of a processing chamber. One or more RF antennas 129 may additionally or alternatively be disposed within the transfer chamber 106, within a load lock (e.g., load locks 104a, 104b), within the factory interface 101 and/or within the cassettes 102. Alternatively RF antennas 129 may be disposed outside the processing chambers 107 and coupled to controller 109.

The RF antennas 129 may be communicatively coupled to the sensor assemblies on a sensor wafer 110. For example, RF signals can be sent from RF antennas 129 to sensor assemblies on a sensor wafer 110 and a return signal can be generated by the sensor assemblies and received by the same RF antenna or another RF antenna 129. The return signal may include information indicative of a measurement of pressure and/or flow of an environment disposed within a processing chamber, load lock, transfer chamber, and so on (e.g., on the surface of the sensor assembly). The RF antennas 129 may be connected to transceivers that generate RF signals and/or that receive RF signals. In some embodiments, one or more RF antennas associated with a processing chamber are connected to an RF transmitter and one or more RF antennas associated with the processing chamber are connected to an RF receiver. In some embodiments, the sensor wafer 110 comprises power components (e.g., batteries, power sources). In some embodiments the sensor wafers 110 may not include any power components (e.g., any batteries), and may instead be powered by the received RF signals generated by the RF antennas 129. In some embodiments, the sensor wafers 110 may be passive devices.

A controller 109 may control various aspects of the processing system 100 and may be communicatively coupled to RF antennas 129. The controller 109 may be and/or include a computing device such as a personal computer, a server computer, a programmable logic controller (PLC), a microcontroller, and so on. The controller 109 may include one or more processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like.

Although not illustrated, the controller 109 may include a data storage device (e.g., one or more disk drives and/or solid state drives), a main memory, a static memory, a network interface, and/or other components. The controller 109 may execute instructions to perform any one or more of the methodologies and/or embodiments described herein. The instructions may be stored on a computer readable storage medium, which may include the main memory, static memory, secondary storage and/or processing device (during execution of the instructions). For example, the controller 109 may execute the instructions to activate one or more RF antennas 129 that are located within the different storage locations, the factory interface 101, the load lock or stations 104a, 104b, the transfer chamber 106, and/or any of the processing chambers 107. The controller 109 may further send instructions through an RF antenna 129 to a sensor wafer 110 to control when the sensors are to turn on, when the sensors are to measure, and what the sensors are to measure (e.g., pressure or flow). For example, the instructions may include individual directions for each sensor of the assembly regarding when to turn on, when to measure, and/or when to turn off. The controller 109 may then receive return RF signals generated by sensor assemblies on the sensor wafer 110, and may analyze the received RF signals. Each of the sensor assemblies may be configured to measure a particular environmental property, such as pressure or flow and to output an RF signal indicative of a measurement of the particular environmental property. Additionally, multiple different sensor assemblies on a sensor wafer may be configured to measure different locations or environmental properties. The controller 109 may receive the RF signals and determine the measurement values (e.g., of amplitude, phase, frequency and/or time-delay) for the environmental property (or properties) that was measured based on the received RF signals. Alternatively, the sensor assemblies may measure an environmental property and store the measurement data locally (e.g., on a local data store of the sensor assembly or within the sensors themselves) and obtain the data when the sensor wafer 110 is retrieved from the processing system 100.

Figure 2:
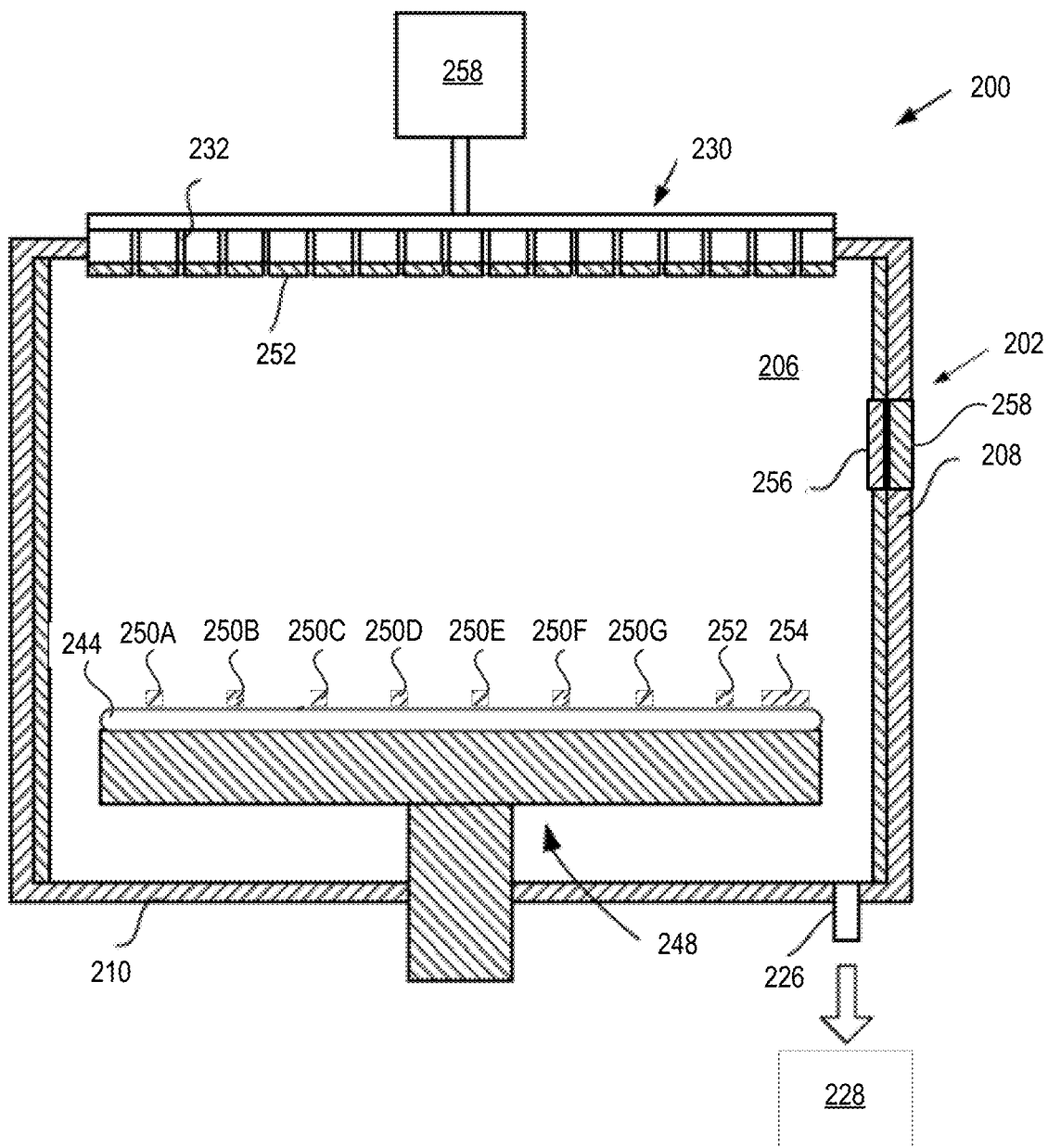
FIG. 2 depicts a sectional view of a processing chamber enclosing a sensor assembly, according to aspects of the disclosure.

FIG. 2 depicts a sectional view of a processing chamber 200 (e.g., a semiconductor processing chamber) enclosing a sensor assembly 244 (e.g., sensor wafer 110 of FIG. 1), according to aspects of the disclosure. The processing chamber 200 may be one or more of etch chambers, deposition chambers (including atomic layer deposition, chemical vapor deposition, physical vapor deposition, or plasma enhanced versions thereof), anneal chambers, and/or the like. For example, the processing chamber 200 may be a chamber for a plasma etch reactor (also known as a plasma etcher), a plasma cleaner, and so forth. Examples of chamber components may include a substrate support assembly 248, an electrostatic chuck (ESC), a ring (e.g., a process kit ring or single ring), a chamber wall, a base, a showerhead 230, a gas distribution plate, a liner, a liner kit, a shield, a plasma screen, a flow equalizer, a cooling base, a chamber viewport, a chamber lid, a nozzle, process kit rings, and so on.

In one embodiment, the processing chamber 200 includes a chamber body 202 and a showerhead 230 that encloses an interior volume 206. The showerhead 230 may or may not include a gas distribution plate. For example, the showerhead 230 may be a multi-piece showerhead that includes a showerhead base and a showerhead gas distribution plate bonded to the showerhead base. Alternatively, the showerhead 230 may be replaced by a lid and a nozzle in some embodiments, or by multiple pie shaped showerhead compartments and plasma generation units in other embodiments. The chamber body 202 may be fabricated from aluminum, stainless steel, or other suitable material. The chamber body 202 generally includes sidewalls 208 and a bottom 210.

An exhaust port 226 may be defined in the chamber body 202, and may couple the interior volume 206 to a pump system 228. The pump system 228 may include one or more pumps and throttle valves utilized to evacuate and regulate the pressure of the interior volume 206 of the processing chamber 200.

The showerhead 230 may be supported on the sidewalls 208 of the chamber body 202 and/or on a top portion of the chamber body. The showerhead 230 (or lid) may be opened to allow access to the interior volume 206 of the processing chamber 200, and may provide a seal for the processing chamber 200 while closed. A gas panel 260 may be coupled to the processing chamber 200 to provide process and/or cleaning gases to the interior volume 206 through the showerhead 230 or lid and nozzle. Showerhead 230 may be used for processing chambers used for dielectric etch (etching of dielectric materials). The showerhead 230 includes multiple gas delivery holes 260 throughout the showerhead 230. The showerhead 230 may be aluminum, anodized aluminum, an aluminum alloy (e.g., Al 6061), or an anodized aluminum alloy. In some embodiments, the showerhead includes a gas distribution plate (GDP) bonded to the showerhead. The GDP may be, for example, Si or SiC. The GDP may additionally include multiple holes that line up with the holes in the showerhead.

Examples of processing gases that may be used to process substrates in the processing chamber 200 include halogen-containing gases, such as $C_2F_6$, $SF_6$, $SiCl_4$, HBr, $NF_3$, $CF_4$, $CHF_3$, $CH_2F_3$, F, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases).

A substrate support assembly 248 is disposed in the interior volume 206 of the processing chamber 200 below the showerhead 230. The substrate support assembly 248 holds a sensor assembly 244 (e.g., a wafer) during processing. The substrate support assembly 248 may include an electrostatic chuck that secures the sensor assembly 244 during processing, a metal cooling plate bonded to the electrostatic chuck, and/or one or more additional components. An inner liner (not shown) may cover a periphery of the substrate support assembly 148. The inner liner may be a halogen-containing gas resistant material such as $Al_2O_3$ or $Y_2O_3$.

A sensor assembly 244 is disposed within the interior volume 206 of the processing chamber 200. The sensor assembly 244 may be disposed between the showerhead 230 and the support assembly 248. The sensor assembly 244 may include or be comprised of a semiconductor layer, a printed circuit board, and/or a housing assembly that is capable of being chucked by a chuck (e.g., electrostatic chuck of the support assembly 248. The sensor assembly 244 may include a substrate having a set of sensors 250A-G including pressure sensors and/or flow sensors disposed on a surface of the substrate. The set of sensors may be designed to measure pressure and/or flow of the interior volume 206 at points located across the surface of the sensor assembly 244.

Figure 6:
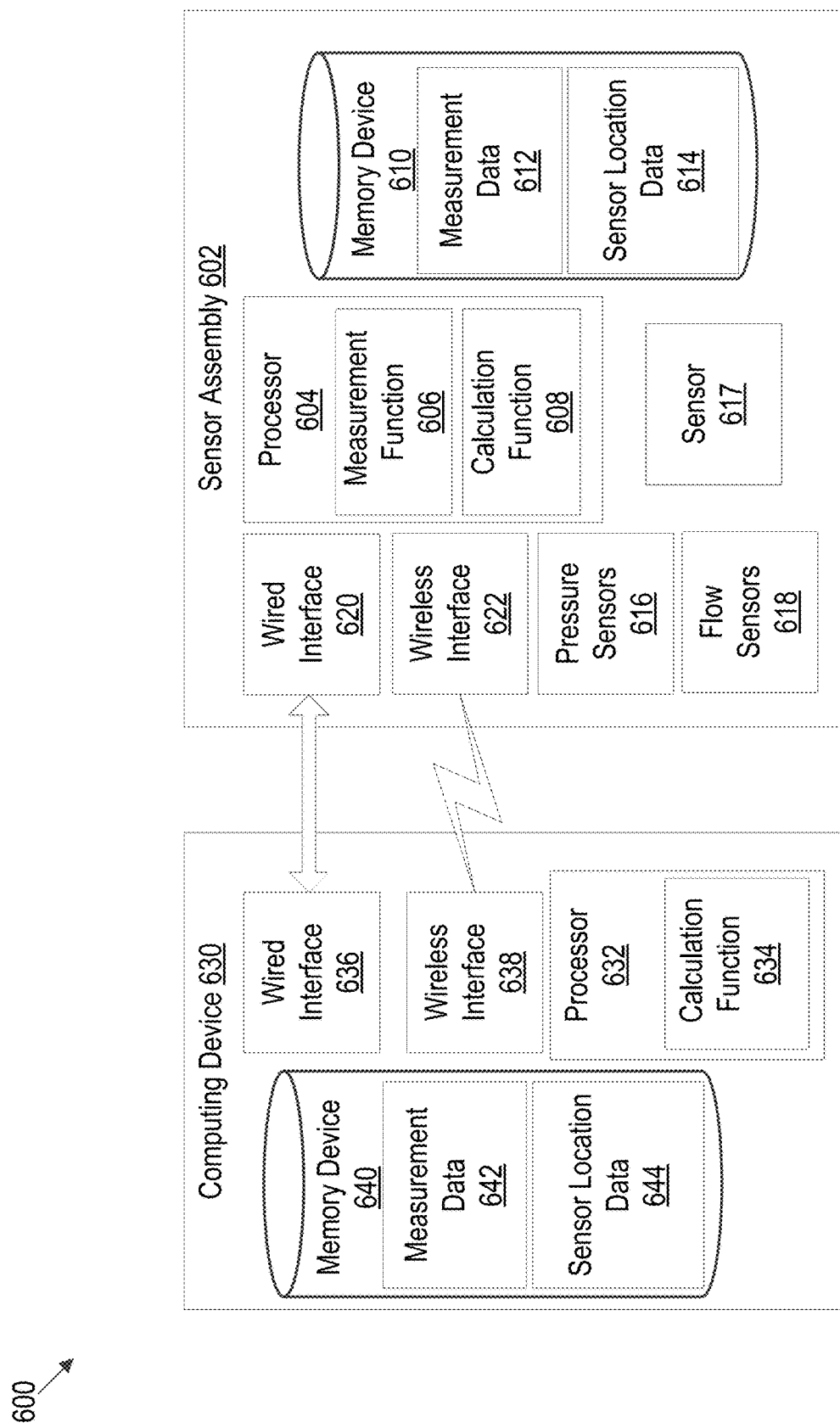
FIG. 6 illustrates a block diagram of a sensor system, according to aspects of the disclosure.

In some embodiments, the sensor assembly 244 may include a controller 254 that may include wireless communication circuitry having an RF antenna that is designed to transmit data associated with pressure and/or flow measurements of the interior volume 206 to a processing device (e.g., computing device 630 of FIG. 6).

In some embodiments, the processing device (e.g., a data reader or radio-frequency identification (RFID) reader) is coupled to an RF antenna 256. In some embodiments, RF antenna 256 may be disposed on or integrated into sidewalls 208 or support assembly 248 to receive an RF signal from the sensor assembly 244. Alternatively, the RF antenna 256 may be disposed outside the processing chamber 200. The RF antenna 256 may be configured to receive an RF signal transmitted from the sensor assembly 244. RF antenna 256 may be coupled to a controller 258 that may be configured to control the RF antenna 256 and send signals to the sensor assembly 244 to control operation of the controller 254, sensor 252, and one or more sensors 250A-G In other embodiments, the sensor assembly 244 may be designed to transfer the measurement data to a processing device through circuitry coupled to the sensor assembly 244 and the processing device. For example, circuitry may be disposed within the support assembly 248 that couples to the sensor assembly 244 and is capable of transmitting data out of the processing chamber 200.

A sensor 252 may be disposed on the sensor assembly 244. Sensor 252 may be coupled to sensor assembly 244 via circuitry or communicatively coupled to sensor assembly 244 wirelessly. Alternatively, as shown in FIG. 2 sensor 252 may be integrated into sensor assembly 244. Sensor 252 may be designed to measure an environmental condition (e.g., pressure, temperature, flow, etc.) of interior volume 206. Sensor 252 may determine when a threshold condition (e.g., vacuum condition, above or below a threshold pressure, temperature, flow, etc.) of the interior volume 206 is met. Sensor 252 may be coupled to controller 254 (e.g., microcontroller). Controller 254 may be configured to control turning sensor 250A-G on and off. Additionally, controller 254 may control the on/off status of communication circuitry coupled to the sensor assembly 244. Controller may be coupled to or comprise memory configured to store data (e.g., sensor measurement data). The controller 254, sensor 252, data store, and other elements of the sensor assembly 244 may be coupled through processing circuits (e.g., op-amp, analog-to-digital converter, sampling and logic circuitry, etc.)

Responsive to determining that the threshold condition is met, sensor 244 communicates to sensor assembly 244 to switch a status of one or more sensors disposed on the sensor assembly 244 between an off status and an on status. For example, it may be desirous to measure the pressure and/or flow of the processing chamber 200 when the interior volume 206 has reached a threshold pressure (e.g., vacuum pressure). It should be noted that the sensors on the sensor assembly 244 may be drawing power from power sources disposed on or integrated in the sensor assembly 244. Additionally, the sensors (e.g., pressure and/or flow sensors) may draw power greater than (e.g., 1 mW or 10 mW) conventional sensors due to desired chamber conditions (e.g., vacuum condition) as well as the chamber size and location of chamber components. For example, the showerhead 230 may be disposed in close proximity (10-50 mm) to support assembly 248. This may require the sensor assembly to only include sensors of a low profile that are capable of fitting between the showerhead 230 and the support assembly 248. As will be discussed in later embodiments, the low-profile sensor may draw more power than conventional sensors not limited in size and/or environmental condition of the chamber. In a further embodiments, sensor 244 may communicate to sensor assembly 244 when the threshold condition (e.g., vacuum condition, above or below a threshold pressure, temperature, flow, etc.) is no longer met and communicates to the sensor assembly to turn on and/or off one or more sensors of sensor assembly 244.

In some embodiments, sensors 250A-G start in an off status. Once the chamber meets a threshold condition sensor 252 will indicate to controller 254 that the threshold condition is met within the chamber. Controller 254 may then change a status between on and off of one or more of the sensors 250A-B. Controller 254 may control communication circuitry on the sensor assembly 244. It should be noted that by reserving power until the interior volume 206 meets a threshold condition, less power is needed for a given operation.

Figure 3:
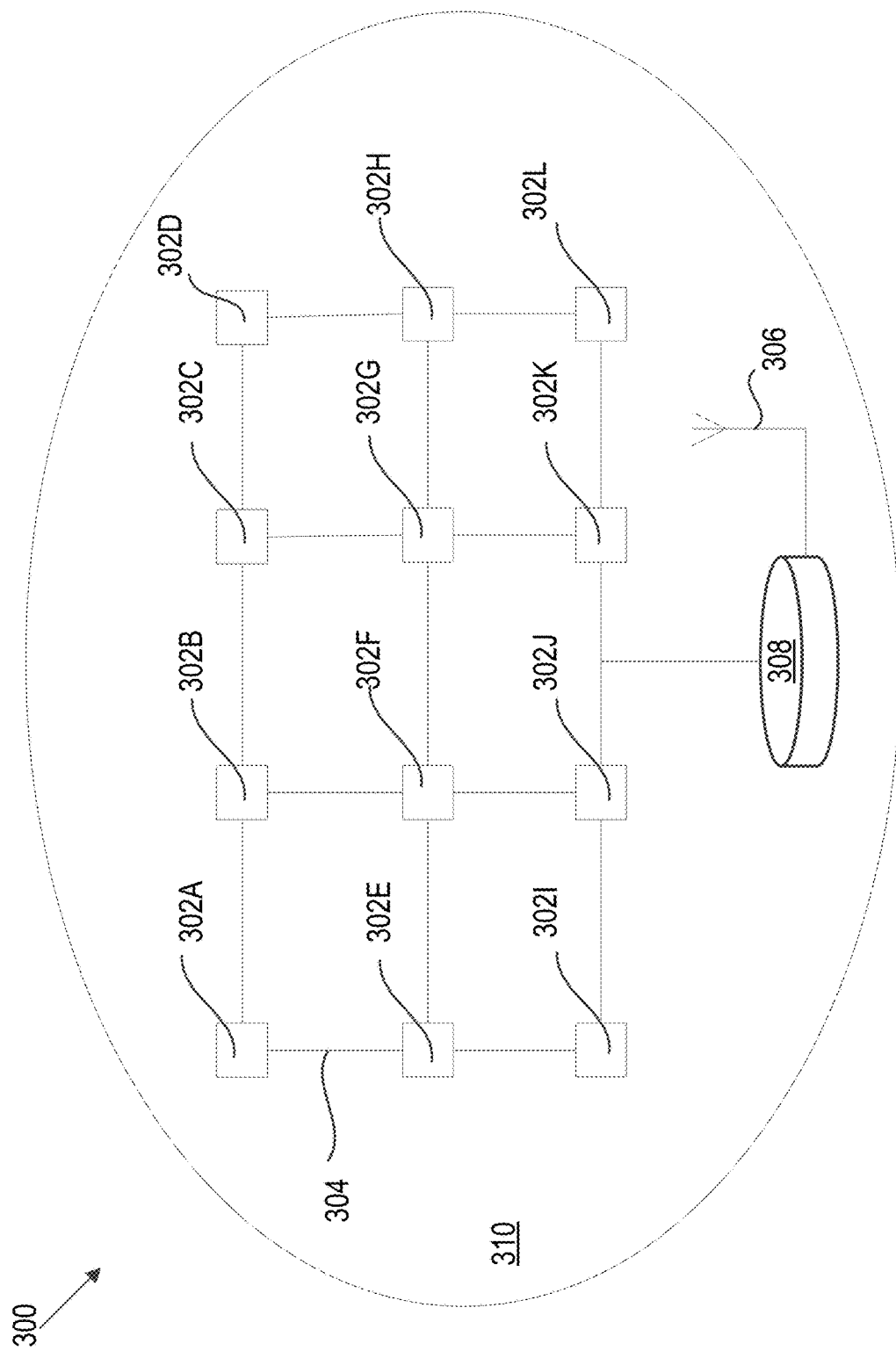
FIG. 3 illustrates a simplified top view of a sensor assembly, according to aspects of the disclosure.

FIG. 3 illustrates a simplified top view of a sensor assembly 300, according to aspects of the disclosure. The sensor assembly may include a substrate 310. The substrate could be a silicon wafer, or could be made of glass, ceramic, printed circuit board material, or other material. The substrate 310 may also be a printed circuit board (PCB) or an enclosed housing. The wafer or other substrate could be smaller, such as a 150 mm wafer, or larger, such as a 300 mm wafer. A number of sensors 302A-L (e.g., pressure and/or flow sensors) are integrated into or attached to the substrate 310. For example, the pressure sensor may be attached with an adhesive such as epoxy. Alternatively, the sensors 302A-L may be attached to the substrate 310 using other adhesives, such as silicone or urethane adhesives.

In some embodiments, the sensors 302A-L may be integrated into the substrate. For example, the sensors may be fabricated onto the substrate 310 (e.g., using lithography steps, etch steps, and so on). Forming the substrate 310 and/or substrate 310 and sensor 302A-L combination may include performing a photoresist deposition operation to deposit a photoresist on a semiconductor material, performing a patterning operation (e.g., with a lithography device) to cure a selective portion of the photoresist, and performing an etch operation (e.g., in an etch chamber) to etch away either the cured portion or the uncured portion of the photoresist. A deposition process (e.g., atomic layer deposition, physical vapor deposition, chemical vapor deposition, etc.) may then be performed (e.g., in a deposition chamber) to deposit a conductive layer (e.g., a metal layer), the sensors 302A-L, communication circuitry 306, controller 308, or circuitry 304 on the semiconductor material and the photoresist formed thereon. A selective etch process may then be performed (e.g., in an etch chamber) to remove the photoresist and the conductive material formed thereon, leaving behind one of the sensors 302A-L, communication circuitry 306, controller 308, or circuitry 304. Multiple sequences of semiconductor fabrication and/or other fabrication operations may be performed to form the sensors on the substrate 310.

In some embodiments, the substrate 310 may be designed or fabricated to be low-profile (e.g., 210 mm in height, 2-5 mm, 2-3 mm, 4-8 mm, etc.). The substrate 310 with the sensors 302A-L may combine to be low-profile (e.g., 2-15 mm in height, 2-5 mm, 4-8 mm, 5-10 mm, 5-15 mm, 10-15 mm, etc.). It should be noted that the low-profile nature of the sensor assembly 300 may allow the sensor to be positioned between chamber equipment such as a showerhead (e.g., showerhead 230 of FIG. 2) and/or a support assembly (e.g., support assembly 248 of FIG. 2).

Sensors 302A-L may include a variety of sensors, such as capacitive sensors, piezoresistive sensor, micro-electrical mechanical system (MEMS) sensors, and so on. The sensors 302A-L may be pressure sensors and/or flow sensors. The pressure sensors may be absolute pressure sensors, which often have a reference pressure sealed on one side of a diaphragm. For example, ion gauge or diaphragm based sensors may be used for a limited pressure range (e.g., $10^{-11}$ to $10^{-3}$ torr). In some embodiments, packaged sensors may be used. In other embodiments, chip sensors may be used. Chip sensors may have less effect on the flow of gas across the surface of the wafer, and hence may cause less disruption of the local pressure across the surface of the sensor assembly 300. Chip sensors may also operate at a wider temperature range than packaged sensors. Alternatively, or additionally, pirani gauge-type sensors may be used such as a thermal conductivity gauge to detect pressure or flow using thermal conductivity pressure dependence. Thermal based sensors such as a Pirani gauge or thermopile may be selected because they may accurately measure pressure ranging from <1 mtorr to 1000 torr, a common range of semiconductor processing within a processing chamber.

The sensors 302A-L may be electrically connected to each other via circuitry 304. Circuitry 304 may comprise a series of circuits, circuit board (e.g., PCB), or any combination thereof to electrically couple one or more sensors 302A-L to each other. For example, circuitry 304 may include interconnected wires soldered to lead pins on the sensors 302A-L and/or leads formed on a PCB.

The sensor assembly 300 may include a controller 308. The controller 308 may include one or more processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. In one embodiment, the controller is a system on a chip (SoC) including a processor, a memory, a wireless module (optionally including an antenna) and/or other components.

The controller 308 may include instructions or processes that govern or direct that sensors 302A-L in measuring pressure and/or flow of an environment proximate each respective sensor. The controller 308 may coordinate which sensors are to turn on and which sensors are to take a measurement at a given point in time. The controller 308 may further receive signals including measurement data from the sensors and transmit the signals including the measurement data (e.g., respective pressure measurements and/or respective flow measurements) to an external system via communication circuitry 306 (e.g., an antenna). Communication circuitry 306 may include an RF antenna. The RF antenna may allow input and output of signals between the sensor assembly 300 and an external processing device (e.g., computing device 630 of FIG. 6). The RF antenna may send signals including data having one or more measurements taken by one or more sensors 302A-L. In one embodiment, communication circuitry 306 is integrated into controller 308.

In some embodiments, the controller 308 may include one or more memory device(s) (e.g., a data store device), which may correspond to any combination of volatile and/or non-volatile storage mechanisms. The memory device(s) may store measurement data taken by one or more of sensors 302A-L. For example, during some processes performed with some processing chambers it may be impossible or overly difficult to transmit a signal out of the processing chamber. The measurement data may be stored via the one or more memory device(s) and may be accessed and the sensor assembly 300 is retrieved from the processing chamber.

In some embodiments, controller 308 includes a wireless module, which may communication wirelessly using a wireless communication protocol such as Zigbee, Bluetooth, Wi-Fi, and so on.

Figure 4A:
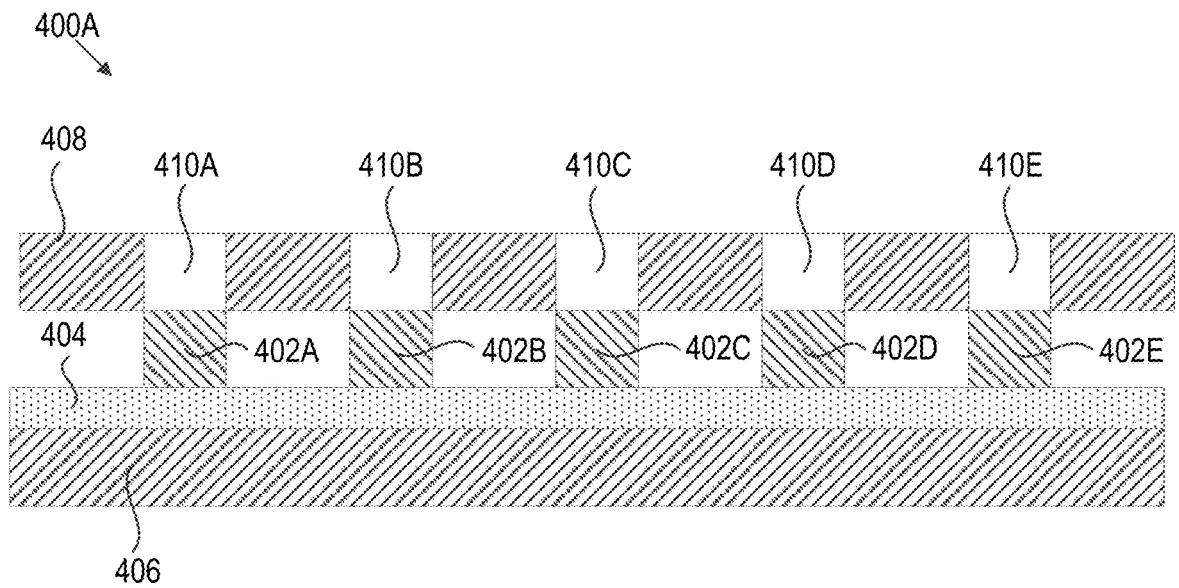
FIGS. 4A-B illustrate cross-sectional views of various embodiments of a sensor assembly, according to aspects of the disclosure.
Figure 4B:
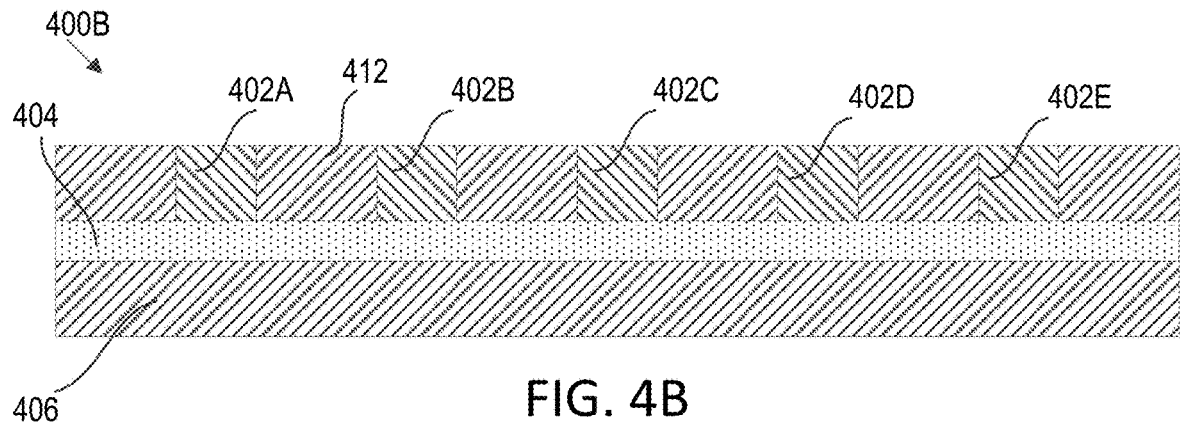

FIGS. 4A-B illustrate cross-sectional views of various embodiments of a sensor assembly 400A-B, according to aspects of the disclosure. As shown in FIGS. 4A-B, the sensor assembly may include a substrate 406. The substrate 406 may include conventional semiconductor wafer material (e.g., a silicon wafer). Alternatively, the substrate 406 may be a printed circuit board, which may have a disc shape. Other possible materials for the substrate include a metal such as aluminum or stainless steel, a ceramic such as Al2O3, AlN, $Y_2O_3$, and/or another material Teflon, a polymer, or a plastic. The substrate 406 may be designed to be chucked (e.g., electrostatically secure) by a chuck of a processing chamber. If the substrate 406 is not composed of a material that can be electrostatically chucked, then the substrate may include a layer of a conductive material (e.g., a metal such as Al or a conductive or semi-conductive ceramic such as $SiO_2$, doped or undoped $Al_2O_3$ or doped or undoped AlN) that enables the coated substrate to be chucked. The layer of the conductive material may be on a backside of the substrate 406.

A housing layer 404 may be disposed on top of the substrate 406. The housing layer 404 may include one or more circuitry, circuit board, and/or conducting elements to electrically couple with sensors 402A-E. For example, the housing layer 404 may include a printed circuit board (PCB) or a housing assembly. The sensors 402A-E may be disposed on a surface of the housing layer 404. The sensors may be attached to or integrated into the housing layer 404. Alternatively, the housing layer 404 may be omitted and the sensors 402A-E may attach to or be integrated into the substrate 406. In some embodiments, the substrate 406 is omitted and the housing layer 404 includes a contact surface to contact a processing chamber component (e.g., chuck).

As shown in FIG. 4A, the sensor assembly 400A may further include a cover 408 or covering layer. The cover 408 may form one or more apertures 410A-E that align with sensors 402A-E. The cover 408 may form a substantially flat surface on a top side of the sensor assembly 400A to promote flow within a processing chamber. Alternatively, the a top surface of the cover 408 may form one or more straight and/or curved channels designed to promote flow across the surface of the sensor assembly 400A.

In some embodiments the cover is removable from the sensor assembly 400A. Alternatively, the cover may be attached to or integrated with sensors 402A-E. The cover may include a ceramic, metallic, or dielectric material. For example, the cover may include a dielectric material such as a ceramic, which may be plasma resistant and/or have a high or low temperature resistance. In some embodiments, the cover is a coating. Examples of dielectric covers that may be used include $Al_2O_3$, AlN, $Y_2O_3$, $Y_3Al_5O_{12}$, yttrium-based oxides, fluorides and/or oxyfluorides, and so on As shown in FIG. 4B, the sensor assembly 400B may further include a packaging layer 412. The packaging layer 412 may be disposed on the plurality of sensors and/or on the housing layer 404 or substrate layer 406 (e.g. in the case of an omitted housing layer) between the disposed sensors 402A-E.

The packaging layer 412 may include a ceramic, metallic, dielectric material, or polymer. For example, the packaging layer 412 may include a dielectric material, which may be plasma resistant and/or have a high or low temperature resistance. Examples of dielectric materials that may be used for the packaging layer 412 include $Al_2O_3$, AlN, $Y_2O_3$, $Y_3A_5O_{12}$, yttrium-based oxides, fluorides and/or oxyfluorides, and so on. In some embodiments, the packaging layer me be deposited on the sensor assembly 400B. For example, depositing the packaging layer may be performed using atomic layer deposition, chemical vapor deposition, physical vapor deposition, or plasma enhanced versions thereof. In another example, the packaging layer 412 may include or be comprised of a polymer, such as a co-polymer, a block co-polymer, a cross-linked polymer, an organic polymer, an inorganic polymer, additional types of polymers, and/or combinations thereof. In the illustrated embodiment, the packaging layer 412 is disposed on the substrate 406 and/or housing layer 404, but not on the sensors 402A-E. In some embodiments, the packaging layer 412 is disposed between the sensors 402A-E and over the sensors 402A-E. In such embodiments, there may be holes or openings in the packing layer that expose a sensor region of each of the sensors 402A-E. The packaging layer 412 and/or cover 408 may be used to minimize obstacles that interrupt laminar air flow.

In some embodiments, the cover 408 and/or packaging layer 412 may be designed to prevent contamination from the sensor assembly to the chamber. Often, process chambers are built with special parameters (e.g., temperature, pressure, vacuum capabilities) that may be affected by a elements of a wafer. For example, the chamber may be protected from unwanted chemicals and particles associated with the sensor assembly 400A-B (e.g., the substrate).

Figure 5:
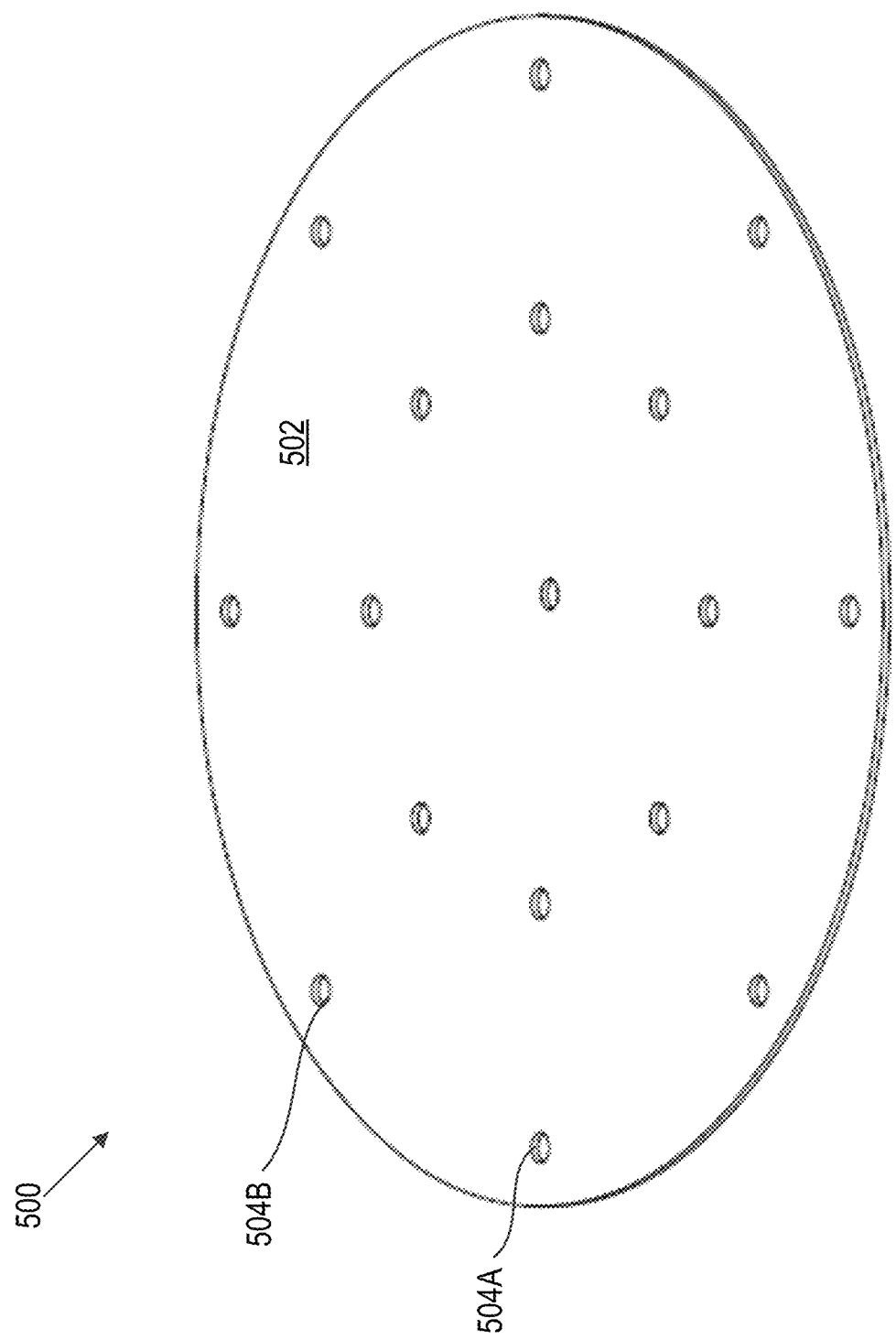
FIG. 5 are top, perspective views of a cover for a sensor assembly, according to aspects of the disclosure.

FIG. 5 is a top, perspective view of a cover 500 for a sensor assembly (e.g., sensor assembly 300 of FIG. 3), according to aspects of the disclosure. As discussed in regards to FIG. 4, a cover 500 may be disposed over a top of the substrate and may enclose one or more sensors (e.g., sensors 302A-L of FIG. 3) or a sensor assembly disposed on or in the substrate. The cover may form an approximately flat surface. The cover may form one or more apertures 504A-B that are designed to align with one or more sensors and allow the sensor exposure to an environment (e.g., interior volume 206 of FIG. 2). The cover may be designed to direct flow across the surface of a sensor assembly. For example, the cover may include one or more curved surfaces to streamline the flow or pressure distribution of a chamber to simulate a representative flow or pressure distribution for a wafer to be processed in the chamber. In some embodiments, the cover has a smooth flat surface to enable laminar airflow. The cover 500 may fit over a substrate, and may include sidewalls (not shown) that support the cover 500 on the substrate.

In some embodiments, the cover 500 may include a dielectric material, which may be plasma resistant and/or have a high temperature resistance (e.g., 300 to 600 Degrees Celsius). Examples of dielectric materials that may be used include $Al_2O_3$, AlN, $Y_2O_3$, $Y_3Al_5O_{12}$, yttrium-based oxides, fluorides and/or oxyfluorides, and so on. Alternatively, the cover may include a silicon substrate, or could be made of glass, ceramic, metal, or other material.

FIG. 6 illustrates a block diagram of a sensor system 600, according to aspects of the disclosure. In one embodiment, sensor system 600 includes the sensor assembly disclosed in any of FIGS. 1-4. Alternatively, the sensor system 600 may be other sensor systems, as described herein.

The sensor system 600 includes a sensor assembly 602 that includes one or more processor(s) 604, such as one or more CPUs, microcontrollers, field programmable gate arrays, or other types of processor. The sensor assembly further includes one or more memory device(s) 610, which may correspond to any combination of volatile and/or non-volatile storage mechanisms. The memory device(s) 610 store data associated with processing and carrying out a measurement function 606 and/or a calculation function 608 to be performed in associated with pressure sensors 616, flow sensors 618, measurement data 612, sensor location data 614, and/or other components. In one embodiment, the memory device(s) 610 stores instructions of methods to measure pressure and/or flow. In another embodiment, the memory device(s) 610 stores instructions of methods to calculate pressure and/or flow distribution using measurement data 612 and sensor location data 614. The sensor assembly 602 performs functions by using processor(s) 604 to execute instructions (e.g., measurement function 606 and/or calculation function 608) provided by the memory device(s) 610.

One or more of the memory device(s) 640, the processor(s) 604, the pressure sensors 616, and/or the flow sensor 618 are coupled to front-end circuitry that includes wireless interface(s) 622 (e.g., radios) and/or wired interface(s) 620. The front-end circuitry may include front-end circuitry, antenna-switching circuitry, impedance matching circuitry, or the like. In addition to sending data, sensor assembly 602 may also receive data, which is sent from computing device 630 via wired interface 636 and/or wireless interface 638 to the appropriate wired interface 620 or wireless interface 622 on the sensor assembly.

The sensor assembly 602 may include an additional sensor 650. The additional sensor 650 may measure a condition (e.g., vacuum condition, pressure, flow, temperature, etc.) of the chamber. In some embodiments, the sensor 617 is always on and the processor 604 is in a low power mode. The remainder of the sensor assembly may be powered down. The processor 604 may periodically receive measurements from the additional sensor 617. If one or more measurements satisfy a condition (e.g., a vacuum condition, above or below a threshold pressure, flow, temperature, etc.), the one or more of the remaining elements of the sensor assembly 602 may be turned on. Sensor 617 may monitor environmental conditions (e.g., of a chamber) and periodically provide measurements to the processor 604 to alter the status one or more of the elements of the sensor assembly 602. It should be noted that power is saved throughout the process by uses elements of the sensor assembly 602 when a condition is met to perform a function (e.g., measure pressure, measure flow, calculate a pressure, send a signal out to computing device, etc.)

Computing device 630 (e.g., endpoint device, remote device, processing system controller) may receive signals from and/or generate signals and send these signal to the sensor assembly 602 via wired interface 636 and/or wireless interface 638. Computing device 630 may be configured to transmit in different frequency bands and/or using different wireless communication protocols. The wireless interfaces 622, 638 may include one or more antennas. The antennas may be directional, omnidirectional, or non-directional antennas.

Computing device 630 may include one or more processor(s) 632, such as one or more CPUs, microcontrollers, field programmable gate arrays, or other types of processors. The computing device 630 further includes one or more memory device(s) 640, which may correspond to any combination of volatile and/or non-volatile storage mechanisms. The memory device(s) 640 store data associated with processing and carrying out a calculation function 634 to be performed in associated with data received from sensor assembly 602. In one embodiment, the memory device(s) 640 stores instructions of methods to calculate pressure and/or flow distributions using measurement data 612 and sensor location data 614 received from sensor assembly 602. The computing device performs functions by using processor(s) 632 to execute instructions (e.g., calculation function 634) provided by the memory device(s) 640.

Figure 7:
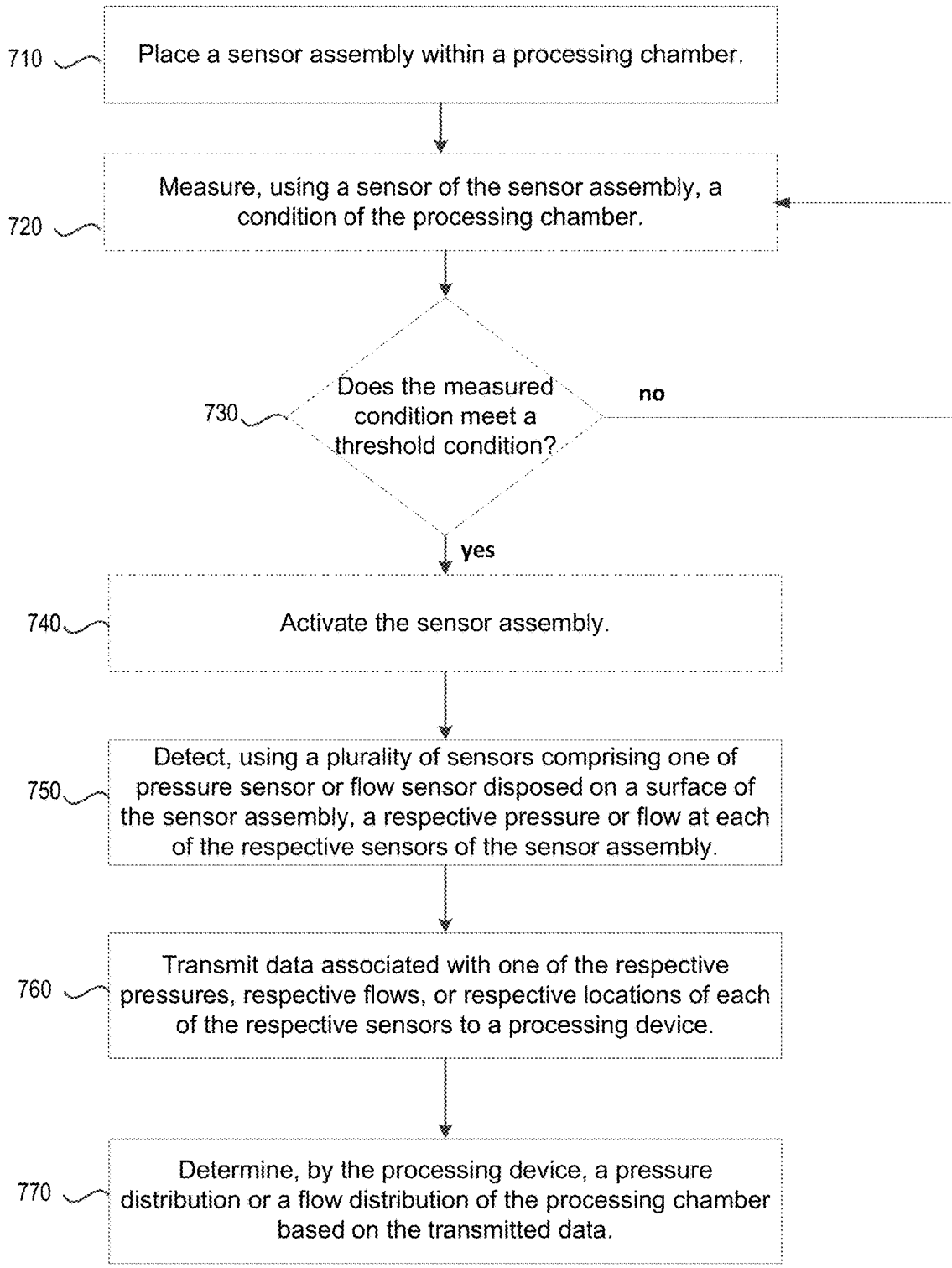
FIG. 7 is a flow chart of a method for measuring pressure or flow distribution within a processing chamber, according to aspects of the disclosure.

FIG. 7 is a flow chart of a method 700 for measuring pressure or flow distribution within a processing chamber, according to aspects of the disclosure. The method 700 may be implemented to measure pressure or flow distribution of an interior volume (e.g., interior volume 206 of FIG. 2) of a processing chamber (e.g., processing chamber 100-200 of FIGS. 1-2).

With reference to FIG. 7, at block 710, a sensor assembly is placed within a processing chamber. In some embodiments, the sensor assembly is placed within the processing chamber by a factory interface 101 (e.g., factory interface 101 of FIG. 1). The factory interface 101 may transfer the sensor assembly into and out of the processing chamber using the same functions for transferring wafer to be processed and/or that have been processed. For example, the factory interface 101 may include a robot that may include a robot arm, which may be or include a selective compliance assembly robot arm (SCARA) robot. The factory interface 101 robot may include an end effector on an end of the robot arm(s). The end effector may be configured to pick and handle specific objects, such as wafers. The factory interface 101 robot may be configured to transfer objects into and out of a processing chamber.

At block 720, a sensor of the sensor assembly measure a condition of the processing chamber. The condition of the processing chamber may be associated with a vacuum condition, a pressure, a flow, a temperature of the processing chamber. The sensor may be a corresponding sensor (e.g., a pressure sensor, a flow sensor, a temperature sensor) to measure the condition. The sensor may be similar to or comprises similar features of sensor disclosed in other embodiments herein.

At block 730, the sensor assembly determine if the measured condition from block 720 meets a threshold condition (e.g., a vacuum condition, above or below a threshold pressure, flow temperature, etc.). If the condition does not meet the threshold condition the method 700 returns to block 720. If the measured condition meets the threshold condition the method 700 advances to block 740.

At block 740, the sensor assembly is activated. This may include powering one or more elements (e.g., one or more sensors, communication circuitry, storage device, controllers, etc.) of the sensor assembly. Prior to block 740 the sensor assembly may be in an off-state or a partially off state until the threshold condition is met at block 730.

In some embodiments, blocks 720-740 are optional and can be used in conjunction with other method blocks disclosed herein and/or known in the art.

At block 750, a set of sensors including pressure sensors and/or flow sensor disposed on a surface of the sensor assembly detect a respective pressure or flow at each of the respective sensors of the sensor assembly. For example, the set of sensors may be disposed in an environment (e.g., a process chamber), and one or more of the sensor may detect a pressure and/or flow on a location proximate the surface of the sensor assembly.

At block 760, data associated with the respective pressures, respective flows, and/or respective locations of a respective sensor is transmitted to a processing device. The data may include one or more pressure or flow measurements that are mapped to a location on a surface of the sensor assembly (e.g., a location within a processing chamber). The data may be transmitted via circuitry connecting the sensor assembly with the processing device. Alternatively, the data may be transmitted wirelessly.

At block 770, a processing device determines a pressure distribution or a flow distribution of the processing chamber based on the transmitted data. Determining a pressure distribution or a flow distribution may include calculating a differential pressure between two or more respective pressure and/or flow measurements using the location of the sensors. In some embodiments, a flow calculation may be performed on the differential pressure to determine flow between two points on the sensor assembly. The pressure and/or flow measurements may be mapped to the locations of the sensors that measure the pressure or whose pressure measurements were used to calculate a flow of a proximate region within the chamber.

In some embodiments, any of the described blocks 710-770 may be coordinated with or occur simultaneous to a chamber process. For example, any of blocks 710-770 may be coordinated with or occur simultaneous to performing a photoresist deposition operation to deposit a photoresist on a substrate, performing a patterning operation (e.g., with a lithography device) to cure a selective portion of the photoresist, and performing an etch operation (e.g., in an etch chamber) to etch away either the cured portion or the uncured portion of the photoresist. Any of block 710-770 may be coordinated with a deposition process (e.g., atomic layer deposition, physical vapor deposition, chemical vapor deposition, etc.). Additionally, any of block 710-770 may be coordinated with a selective etch process performed (e.g., in an etch chamber).

In some embodiments, the processes defined by blocks 710-770 may further include, detecting, by a sensor of a processing chamber, that an environmental condition meets a threshold condition (e.g., vacuum pressure, above or below a threshold temperatures, above or below a threshold pressure, etc.) of an environment disposed within the processing chamber. The process may further include receiving an indication from the sensor that the condition of the environments meets the threshold condition. The process may further include, responsive to receiving the indication, the controller may switch one or more of the plurality of sensors between an on status and an off status. For example, the threshold condition may be associated with a vacuum condition of the environment and the sensor would send an indication to turn on or off a sensor on the sensor assembly when the chamber reaches a vacuum condition. The sensor may be one of the sensors in the set of sensors used to measure pressure and/or flow within the processing chamber.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A sensor assembly comprising:
   a substrate;
   a controller disposed on the substrate;
   a plurality of first sensors activatable by the controller responsive to a determination by the controller that one or more of a threshold pressure condition or a threshold temperature condition is met, the plurality of first sensors comprising at least one of pressure sensors or flow sensors disposed across a surface of the substrate, wherein each respective sensor of the plurality of first sensors is adapted to:
      measure a respective pressure or a respective flow of an environment proximate the respective sensor; and
      output a respective signal associated with the measured respective pressure or the measured respective flow;
   wherein the respective signals associated with the measured respective pressures or the measured respective flows measured by the plurality of first sensors together provide at least one of a pressure distribution across the surface of the substrate or a flow distribution across the surface of the substrate.

2. The sensor assembly of claim 1, wherein the substrate comprises at least one of a semiconductor wafer, a printed circuit board (PCB), or a housing assembly, wherein the substrate is adapted to be chucked by a chuck of a processing chamber.

3. The sensor assembly of claim 1, further comprising a packaging layer disposed at least one of on the plurality of first sensors or on the substrate between the plurality of first sensors.

4. The sensor assembly of claim 3, wherein a combination of the packaging layer and the plurality of first sensors covers the surface of the substrate, wherein the packaging layer and the plurality of first sensors are aligned to form an approximately flat surface.

5. The sensor assembly of claim 1, further comprising:
   one or more circuit boards to which the plurality of first sensors are connected; and
   a data storage device coupled to the one or more circuit boards, wherein the data storage device is adapted to receive the respective signals and store the measured respective pressures or flows.

6. The sensor assembly of claim 1, further comprising:
   one or more circuit boards to which the plurality of first sensors are connected; and
   a wireless communication circuit coupled to the one or more circuit boards, the wireless communication circuit adapted to transmit the respective signals to a remote processing device.

7. The sensor assembly of claim 1, wherein at least one of the plurality of first sensors comprises a thermal conductivity gauge to detect pressure or flow using thermal conductivity pressure dependence.

8. The sensor assembly of claim 1, wherein the plurality of first sensors comprises at least 10 sensor devices, and wherein the sensor assembly comprises a sensor wafer having a height of at most 2 mm.

9. The sensor assembly of claim 1, wherein at least one of the plurality of first sensors comprises a micro-electrical mechanical system (MEMS) pressure or flow sensor.

10. The sensor assembly of claim 1, further comprising:
    a second sensor coupled to the controller, the second sensor is adapted to detect that a condition of the environment meets one or more of the threshold pressure condition or the threshold temperature condition; and
    the controller coupled to the second sensor, the controller adapted to:
       receive an indication from the second sensor that the condition of the environment meets one or more of the threshold pressure condition or the threshold temperature condition; and
    responsive to receiving the indication, switch one or more of the plurality of first sensors between an on status and an off status.

11. The sensor assembly of claim 10, wherein the threshold pressure condition is associated with a vacuum condition of the environment.

12. The sensor assembly of claim 10, wherein the second sensor is one of the plurality of first sensors.

* * * * *